United States Patent
Fishley et al.

(10) Patent No.: US 6,654,248 B1
(45) Date of Patent: Nov. 25, 2003

(54) TOP GATED HEAT DISSIPATION

(75) Inventors: Clifford R. Fishley, San Jose, CA (US); Maurice O. Othieno, Union City, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/280,566

(22) Filed: Oct. 25, 2002

(51) Int. Cl.$^7$ .................................................. H05K 7/20
(52) U.S. Cl. ....................... 361/704; 361/705; 361/708; 257/706; 257/707; 257/712; 257/713; 257/787; 257/796
(58) Field of Search .............................. 361/704, 705, 361/707, 717; 257/675, 687, 706, 707, 796; 165/80.3, 185

(56) References Cited

U.S. PATENT DOCUMENTS

| | | | | |
|---|---|---|---|---|
| 5,381,042 A | * | 1/1995 | Lerner et al. ............... | 257/712 |
| 6,166,434 A | * | 12/2000 | Desai et al. ................. | 257/704 |
| 6,191,360 B1 | * | 2/2001 | Tao et al. ................... | 174/52.4 |
| 6,208,519 B1 | * | 3/2001 | Jiang et al. ................. | 361/717 |
| 6,246,115 B1 | * | 6/2001 | Tang et al. ................. | 257/706 |
| 6,362,516 B1 | * | 3/2002 | Waters ....................... | 257/678 |
| 6,432,742 B1 | * | 8/2002 | Guan et al. ................. | 438/106 |
| 6,433,420 B1 | * | 8/2002 | Yang et al. ................. | 257/712 |
| 6,469,380 B2 | * | 10/2002 | Sorimachi et al. .......... | 257/706 |
| 6,525,421 B1 | * | 2/2003 | Chia et al. .................. | 257/730 |

\* cited by examiner

Primary Examiner—Boris Chérvinsky
(74) Attorney, Agent, or Firm—Luedeka, Neely & Graham, PC

(57) ABSTRACT

A heat spreader for use with an integrated circuit in a package, where the heat spreader is formed as a plate having a centrally disposed aperture with a diameter that is smaller than a minimum diameter of the integrated circuit. The heat spreader has an overall diameter that is no greater than a minimum diameter of the package. In this manner, the aperture in the heat spreader allows the plastic injected through a top gated mold form to pass through the heat spreader and more uniformly encapsulate the integrated circuit.

10 Claims, 1 Drawing Sheet

TOP GATED HEAT DISSIPATION

FIELD

This invention relates to the field of integrated circuit fabrication. More particularly, this invention relates to heat dissipation in packaged integrated circuits.

BACKGROUND

Integrated circuits are typically packaged prior to use, so that they are both easier to handle, and so that they are less susceptible to damage from handling and environment. Thus, integrated circuit packages provide a valuable function. However, with the benefits of the package also come certain problems. For example, localized areas of electrical activity within an integrated circuit tend to produce thermal energy as a result of electron motion. Unless the thermal energy is dissipated, it tends to build up within the localized areas and is expressed as a temperature increase in the integrated circuit. If the thermal energy builds up to sufficient degree, the temperature can increase to a point where the delicate structures of the integrated circuit either malfunction or are permanently damaged.

When the integrated circuit is open to the environment, there tends to be good thermal transport from the integrated circuit, primarily by convection with the surrounding atmosphere. However, when the integrated circuit is packaged, as is typically desired, the package materials tend to inhibit the dissipation of the thermal energy from the integrated circuit to the surrounding environment. Although the package materials are able to dissipate a certain amount of thermal energy via conductance through the package materials, this amount of thermal energy dissipation often tends to be inadequate. The reason for this is that the materials of the integrated circuit package tend to be primarily selected for other properties, such as the protection that they will provide to the integrated circuit, rather than for heat conductance properties.

For example, one type of packaging material that is commonly used is one or more of a variety of molded thermoplastic resins, commonly called plastic packages. Plastic packages are often preferred for certain types of integrated circuits, such as wire bonded integrated circuits, because of their versatility and ease of formation. For example, the plastic tends to easily flow in and around the wires that electrically connect the wire bonded integrated circuit to the electrical connections of the packaging, providing both mechanical support and electrical insulation to the wires. Unfortunately, the plastic tends to be a very poor thermal conductor. Unfortunately, many modifications that could be made to the plastic itself that would improve the thermal conductivity of the plastic would also increase the electrical conductance or capacitance of the plastic, and would thus be counter productive.

To overcome this tendency for thermal energy to build up in parts of the plastic molded integrated circuit package, additional structures have been added to the package, which additional structures are generally referred to as heat spreaders. The heat spreader is typically a structure formed of a material having a thermal conductivity that is at least somewhat greater than the plastic that is used to encapsulate the integrated circuit, such as metal. The heat spreader typically has the general form of a plate that is disposed over the integrated circuit and extends down into the plastic encapsulant to contact the package substrate. In this manner, the plastic encapsulant helps retain the heat spreader as part of the integrated circuit package. However, the heat spreader should not make contact with the wires that electrically connect the integrated circuit to the electrical connections of the packaging, so that electrical shorting of the wires does not occur.

The package is typically formed by disposing the heat spreader over the wire bonded integrated circuit within a package mold form, and injecting the plastic into the mold form, encapsulating the integrated circuit and portions of the heat spreader. Because the heat spreader is basically a solid plate, and resides over the integrated circuit, the plastic is preferably injected into the mold form from the sides of the mold form, in what is called a side gated injection.

When the packaged integrated circuit is relatively small, a side gated injection works well enough. However, if the packaged integrated circuit is relatively large, then the plastic injected during a side gated process may not distribute properly throughout the package. In addition, molding compound injected from the sides tends to move the wires somewhat as it flows by them in a condition typically referred to as wire sweep. When wire sweep is severe enough, the wires may actually touch each other, thereby electrically shorting the signals that they are to carry.

One method of overcoming these problems would be to inject the plastic from another point in the mold form, such as from the top and center of the mold form, in a top gated process. Unfortunately, the heat spreader interferes dramatically with a top gated injection, because it blocks the flow of the plastic that is injected at the top of the mold form.

What is needed, therefore, is a system by which an integrated circuit may be more uniformly encapsulated in a plastic injection packaging process.

SUMMARY

The above and other needs are met by a heat spreader for use with an integrated circuit in a package, where the heat spreader is formed as a plate having a centrally disposed aperture with a diameter that is smaller than a minimum diameter of the integrated circuit. The heat spreader has an overall diameter that is no greater than a minimum diameter of the package. In this manner, the aperture in the heat spreader allows the plastic injected through a top gated mold form to pass through the heat spreader and more uniformly encapsulate the integrated circuit. In addition, because the molding compound is flowing radially outward from the top center of the package, the flow of the molding compound does not sweep the wires into one another.

In various preferred embodiments of the invention, the heat spreader is between about twenty millimeters and about fifty millimeters square, and most preferably about thirty-five millimeters square. The aperture in the heat spreader is preferably between about one millimeter and about ten millimeters in diameter, and most preferably about two millimeters in diameter. Preferably, the heat spreader is between about one tenth millimeters and about five tenths millimeters in thickness, and most preferably about three tenths millimeters in thickness. The heat spreader is preferably made of copper and is nickel plated with a first surface with black oxide treatment.

According to another aspect of the invention there is described an integrated circuit package. A package substrate for receiving an integrated circuit is provided, where the package substrate has electrical contacts. An integrated circuit is disposed on the package substrate, where the integrated circuit also has electrical contacts. Wires are electrically connected by a first end to the electrical contacts on the integrated circuit and are electrically connected by a second end to the electrical contacts on the package substrate. The integrated circuit and the wires reside within a first level. A heat spreader with a centrally disposed aperture with a diameter that is no greater than a minimum diameter of the integrated circuit overlies and surrounds the integrated circuit. A molding compound encapsulates the integrated circuit and portions of the heat spreader to the package substrate.

According to yet another aspect of the invention, there is described a method of packaging an integrated circuit. The integrated circuit is attached to a package substrate having electrical contacts, thereby forming a package subassembly. Wires are wire bonded from the electrical contacts on the package substrate to electrical contacts on the integrated circuit. A heat spreader having a centrally disposed aperture having a diameter that is no greater than a minimum diameter of the integrated circuit, and at least a portion of the package subassembly are placed within a mold cavity. The heat spreader is disposed over but not touching the wires of the package subassembly. The heat spreader is disposed between the package subassembly and a top gate of the mold cavity. A plastic is injected through the top gate in the mold cavity, and the plastic thereby flows through the centrally disposed aperture to encapsulate the integrated circuit and portions of the heat spreader to the package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
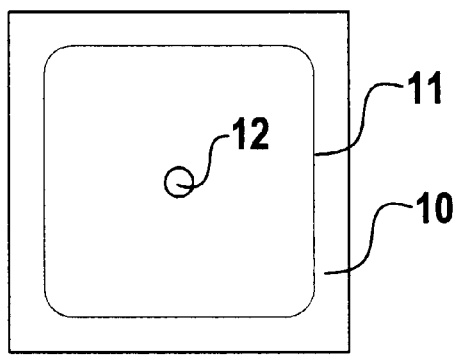
FIG. 1 is a top plan view of a heat spreader according to the present invention.
Figure 2:
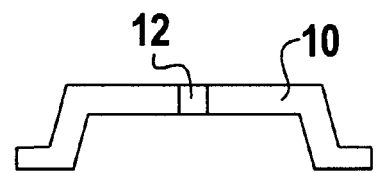
FIG. 2 is a cross sectional view of a heat spreader according to the present invention.

With reference now to FIG. 1 there is depicted a top plan view of a heat spreader according to the present invention, with a centrally disposed aperture 12. As described above, the primary purpose of the aperture 12 is to allow molding compound, such as plastics, to flow into a top gated mold form and through the heat spreader 10 so as to more uniformly encapsulate an integrated circuit. Edge 11 depicts a bend in the heat spreader 10, where is bends from a higher level to a lower level. The higher level preferably fits over the integrated circuit and the lower level preferably fits against the package substrate, as depicted and described hereafter. FIG. 2 is a cross sectional view of the heat spreader 10, showing the centrally disposed aperture 12, which goes completely through the heat spreader 10, and the higher and lower levels of the heat spreader 10.

The heat spreader 10 is preferably between about twenty millimeters and about fifty millimeters square, and most preferably about thirty-five millimeters square. The aperture in the heat spreader is preferably between about one millimeter and about ten millimeters in diameter, and most preferably about two millimeters in diameter. Preferably, the heat spreader is between about one tenth millimeter and about five tenths millimeters in thickness, and most preferably about three tenths millimeters in thickness. The heat spreader is preferably made of copper and is nickel plated with a first surface with black oxide treatment. It is appreciated that neither the heat spreader 10 nor the aperture 12 need have the shapes as depicted in FIGS. 1 and 2, square and round respectively, but may alternately be of other shapes.

Figure 3:
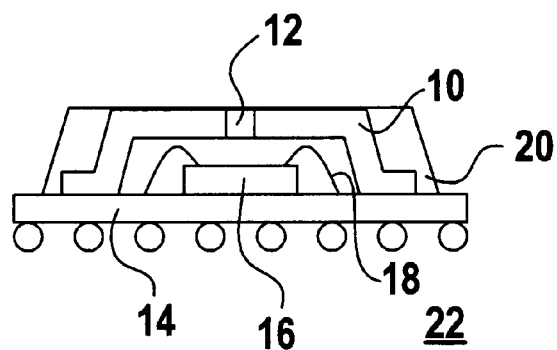
FIG. 3 is a cross sectional view of a packaged integrated circuit according to the present invention.

FIG. 3 is a cross sectional view of a packaged integrated circuit 22 according to the present invention. The heat spreader 10 is disposed over the integrated circuit 16, and the wires 18 by which the integrated circuit 16 is electrically connected to the package substrate 14, and also fits against the top surface of the package substrate 14. Thus, the heat spreader 10 overlies and surrounds the integrated circuit 16. The integrated circuit 16 is preferably physically attached to the package substrate 14 also. A molding compound 20, such as plastic, encapsulates the integrated circuit 16 and the lower level of the heat spreader 10 to the package substrate 14.

The aperture 12 in the heat spreader 10 has a diameter that is preferably no greater than, and most preferably much smaller than, the diameter of the integrated circuit 16. In this manner, a sufficient amount of the molding compound 20 may flow through the aperture 12, but there is sufficient surface area left on the heat spreader 10 to adequately dissipate thermal energy generated in the integrated circuit 16. It is appreciated that the integrated circuit 16 is typically a rectilinear device and not round, and thus the term "diameter" is somewhat unusual as applied to the integrated circuit 16. However, use of this term is made in reference to any dimension as measured across the upper surface of the integrated circuit 16, whether that dimension be length, width, or otherwise.

Figure 4:
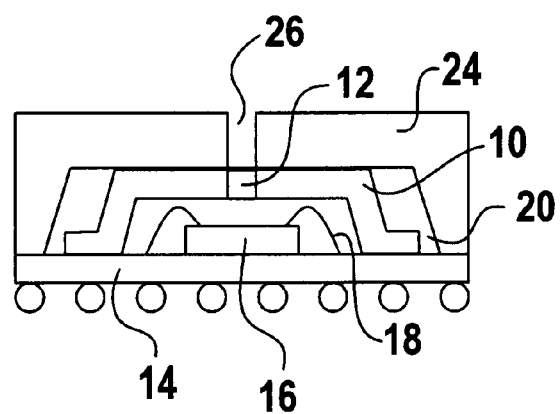
FIG. 4 is a cross sectional view of an integrated circuit, package substrate, and heat spreader within an injection mold form, according to the present invention.

With reference now to FIG. 4, there is depicted a cross sectional view of an integrated circuit 16, package substrate 14, and heat spreader 10 within an injection mold form 24, according to the present invention. As can be seen in FIG. 4, the molding compound 20 preferably flows into the mold form 24 through a top gate 26. The molding compound 20 is able to flow through the heat spreader 10 through the centrally disposed aperture 12.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of packaging an integrated circuit, the method comprising the steps of:

attaching the integrated circuit to a package substrate having electrical contacts, thereby forming a package subassembly, wire bonding wires from the electrical contacts on the package substrate to electrical contacts on the integrated circuit, placing a heat spreader having a centrally disposed aperture having a diameter that is no greater than a minimum diameter of the integrated circuit and at least a portion of the package subassembly within a mold cavity, the heat spreader disposed over but not touching the wires of the package subassembly, the heat spreader disposed between the package subassembly and a top gate of the mold cavity, and injecting a plastic through the top gate in the mold cavity, the plastic thereby flowing through the centrally disposed aperture to encapsulate the integrated circuit and portions of the heat spreader to the package substrate.

2. The method of claim 1, wherein the heat spreader is between about twenty millimeters and about fifty millimeters square.

3. The method of claim 1, wherein the heat spreader is about thirty-five millimeters square.

4. The method of claim 1, wherein the aperture in the heat spreader is between about one millimeter and about ten millimeters in diameter.

5. The method of claim 1, wherein the aperture in the heat spreader is about two millimeters in diameter.

6. The method of claim 1, wherein the heat spreader is between about one tenth millimeter and about five tenths millimeters in thickness.

7. The method of claim 1, wherein the heat spreader is about three tenths millimeters in thickness.

8. The method of claim 1, wherein the heat spreader is made of copper.

9. The method of claim 1, wherein the heat spreader is nickel plated.

10. The method of claim 1, wherein the heat spreader has a first surface with black oxide treatment.

* * * * *